(12) United States Patent
Zucker

(10) Patent No.: US 8,410,859 B2
(45) Date of Patent: Apr. 2, 2013

(54) MICROWAVE GENERATOR AND PROCESSES THEREOF

(76) Inventor: Oved S.F. Zucker, Annandale, VA (US)

( * ) Notice: Subject to any disclaimer, the term of this patent is extended or adjusted under 35 U.S.C. 154(b) by 354 days.

(21) Appl. No.: 12/902,203

(22) Filed: Oct. 12, 2010

(65) Prior Publication Data

US 2011/0248767 A1    Oct. 13, 2011

Related U.S. Application Data

(60) Provisional application No. 61/250,037, filed on Oct. 9, 2009.

(51) Int. Cl.
*H03K 3/42* (2006.01)
(52) U.S. Cl. .............................. 331/96; 333/20; 307/106
(58) Field of Classification Search ................. 331/96; 333/20; 307/106
See application file for complete search history.

(56) References Cited

U.S. PATENT DOCUMENTS

| | | | | |
|---|---|---|---|---|
| 5,109,203 A | * | 4/1992 | Zucker et al. | 331/96 |
| 5,185,586 A | * | 2/1993 | Zucker | 331/96 |
| 7,268,641 B2 | * | 9/2007 | Zucker et al. | 333/20 |
| 7,365,615 B2 | * | 4/2008 | Zucker et al. | 333/20 |
| 7,633,182 B2 | * | 12/2009 | London | 307/106 |

* cited by examiner

*Primary Examiner* — Joseph Chang

(57) ABSTRACT

A microwave generator and/or methods thereof. A microwave generator may include a plurality of connected sequential sections in cascade. A microwave generator may include a first section and an output section. Each section may include an intermediate conductor, an upper conductor and a lower conductor. A first isolating material having a first thickness may be connected between an intermediate conductor and an upper conductor. A second isolating material having a second thickness may be connected between an intermediate conductor and a lower conductor. A switch may be connected between an intermediate conductor and an upper conductor and/or a lower conductor, forming a switched thickness and an unswitched thickness. The unswitched thickness of an output section is larger than the unswitched thickness of the first section and the increase in unswitched thickness from the first section to the output section includes a monotonic increase.

20 Claims, 12 Drawing Sheets

MICROWAVE GENERATOR AND PROCESSES THEREOF

Figure 1:
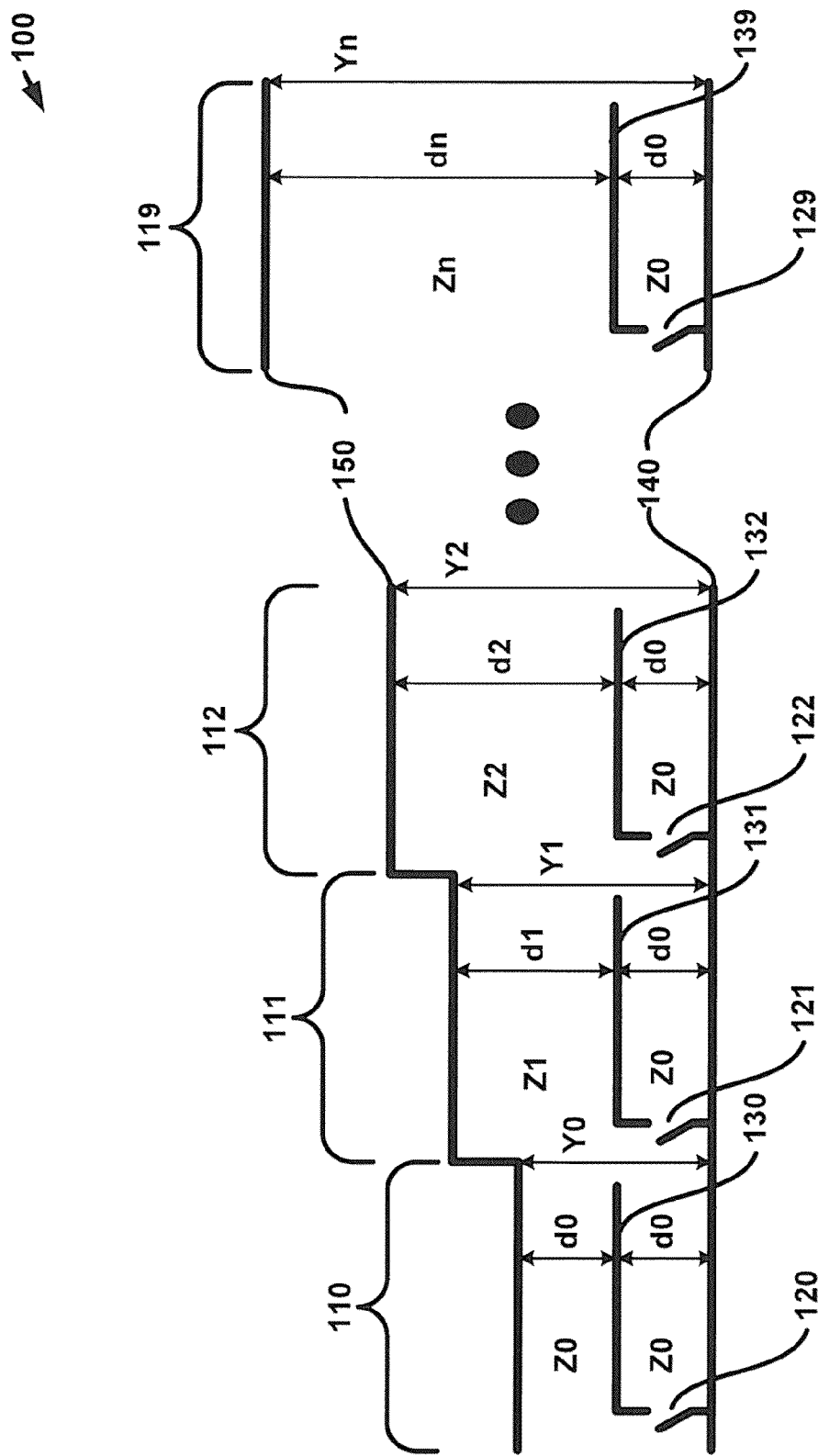

The present application claims priority to U.S. Provisional Patent Application No. 61/250,037 (filed on Oct. 9, 2009), which is hereby incorporated by reference in its entirety.

BACKGROUND

Embodiments relate to electric and/or electronic devices, and methods thereof. Some embodiments relate to digital synthesis, for example microwave generation and methods thereof.

Adding a positive square pulse, for example half a nanosecond long, to a substantially similar negative pulse that immediately follows it may refer to a cycle of microwaves including a GHz fundamental frequency. Pulse length may range, for example, between approximately 10 ns and ps's. The process may be repeated to produce more cycles and/or longer pulses. The approach may be desirable for generating high power microwaves (HPM) since the power available may exceed resonant based generation such as magnetron and klystrons.

Transmission lines (TL's) utilizing a relatively thin dielectric film may include relatively smaller impedance and/or include relatively larger breakdown electric fields. Since the pointing vector, which may reference the measure power flow in a TL, is proportional to the electric filed squared, such circuits may correspond to a relatively higher power per unit volume of source. However, using relatively thin dielectric films may increase dissipation in the TL conductors due to the skin depth effect. Such dissipation limits the efficiency and reduces the number of sections that can be added which limits the number of cycles an total pulse length and thus pulse energy.

Photoconductive switches may be used to accommodate a relatively higher switching power. Si back biased junctions, which may be activated with 1.06 micron laser pulses (pulsed YAG laser), may have the current, switching power and speed required to switch relatively thin film TL's. However, using such switches does not minimize dissipation in the TL conductors, for example resulting from relatively thin films.

A charged TL may be discharged with a switch into a matched load impedance in double TL duration to generate the fastest possible discharge and thus pulses with the highest possible power. There have been attempts to produce relatively more cycles by adding TL sections interconnected with switches. Two related circuits may include a frozen wave circuit (Proud et al., "High Frequency Waveform Generation Using Optoelectronic Switching in Silicon", IEEE Trans on Microwave Theory and Techniques, Vol. MTT-26, No. 3 (1978)), where switches may be all closed at once, and a sequential switch circuit (U.S. Pat. Nos. 5,109,203 and 5,185,586 to Zucker et al.), where the first switch closed is nearest the load with the next switch in line closed at least two transit time later ($2\tau$). Since the energy from the back of the system flows through the closed switches ahead, there exist a cumulative loss in the switches which may reduce the number of sections that may be connected.

A Switch Bypass Source (SBS) circuit (U.S. Pat. Nos. 7,268,641 and 7,365,615 to Zucker et al.) may allow pulses to bypass still-open switches. The first switch closed is the one farthest from the load, and the generated pulse travels in the two outer conductors bypassing the not yet closed switches ahead of it. Cumulative switch loss is thus minimized, more switches may be used to produce relatively more cycles with its attendant larger energy. While SBS increases the number of cycles that can be produced, a second dissipation effect due to skin depth losses becomes important, which results in a new limit on the total number of switches/sections, and thus cycles that can be produced.

An SBS circuit may partially addresses skin depth dissipation in the TL's, which is proportional to the penetration depth and inversely proportional to the TL's separation, for example the thickness of a relatively thin film. Skin depth dissipation in TL's may be partially addressed in U.S. Pat. Nos. 7,268,641 and 7,365,615 to Zucker et al. in either of two ways. In the first, the dielectric spacing of the unswitched lines is increased uniformly in all section to a value twice the dielectric spacing of the switched lines. In the second, the overall spacings taper downward in the direction of the load. These two approaches and variations thereof only marginally improve on the basic circuits in the resulting number of pulses that can be practically produced in reasonable volumes and/or efficiency.

Therefore, in order to be able to use more sections which are needed to produce more cycles and thus longer microwave pulses without prohibitive losses, reduced power, and/or increased apparatus volume, there is a need for electronic and/or electrical devices, and methods thereof.

SUMMARY

Embodiments relate to electric and/or electronic devices, and methods thereof. Some embodiments relate to digital synthesis of signals. According to embodiments, microwaves may be generated. In embodiments, microwaves may be generated one temporal part at a time. Embodiments relate to a microwave generator. According to embodiments, a microwave generator may include a plurality of connected sections. According to embodiments, a microwave generator may include a plurality of connected sequential sections in cascade. In embodiments, the number of cycles of an output signal may be selected, for example determined by the number of sections of a plurality of connected sections. In embodiments, the length a section may be selected. In embodiments, the length of each of a plurality of connected sections may be a quarter wavelength.

According to embodiments, each of a plurality of connected sections may include an intermediate conductor, an upper conductor and/or a lower conductor. In embodiments, each of a plurality of connected sections may include a first isolating material having a first thickness (and/or first impedance) connected between the intermediate conductor and the upper conductor and/or a second isolating material having a second thickness (and/or second impedance) connected between the intermediate conductor and the lower conductor.

According to embodiments, each of a plurality of connected sections may include a switch. In embodiments, a microwave generator may include one or more photoconductive switches. In embodiments, any switch may be included.

According to embodiments, a microwave generator may be configured for a switch in each subsequent section among a plurality of connected sections to be switched sequentially, for example from a first section to an output section. In embodiments, timing of the switching may be selected. In embodiments, the switching timing between any two subsequent sections from a first section to an output section may be delayed by $3\tau$, where $\tau$ may reference the transit time of the line switched first. According to embodiments, a switch may be connected between an intermediate conductor and an upper conductor. In embodiments, a switch may be connected between an intermediate conductor and a lower conductor. In embodiments, a switch may be connected between a lower conductor or an upper conductor in a majority of a plurality of connected sections. In embodiments, switches in adjacent sections of, a majority of a plurality of connected sections may be alternately connected, for example between an intermediate conductor and an upper conductor and/or an intermediate conductor and, a lower conductor. In embodiments, switches in an equal number of a plurality of connected sections may be connected between an intermediate conductor and an upper conductor and an intermediate conductor and a lower conductor. In embodiments, a switch in some sections of a plurality of connected sections may be alternately connected between an intermediate conductor and an upper conductor and an intermediate conductor and a lower conductor.

According to embodiments, a first thickness (and/or first impedance) of a first isolating material may be a switched thickness (and/or a switched impedance), and/or a second thickness (and/or second impedance) of a second isolating material may be an unswitched thickness (and/or an unswitched impedance). In embodiments, a second thickness (and/or second impedance) of a second isolating material may be a switched thickness (and/or a switched impedance), and/or a first thickness (and/or first impedance) of a first isolating material may be an unswitched thickness (and/or an unswitched impedance). In embodiments, an unswitched thickness (and/or unswitched impedance) in at least two of a plurality of connected sections may be different, the same and/or substantially the same.

According to embodiments, a microwave generator may include a plurality of connected sections having a first section and/or an output section. In embodiments, the unswitched thickness (and/or unswitched impedance) of an output section may be larger than an unswitched thickness (and/or unswitched impedance) of a first section. In embodiments, a ratio between an unswitched thickness (and/or unswitched impedance) and a switched thickness (and/or switched impedance) of an output section to an unswitched thickness (and/or unswitched impedance) and a switched thickness (and/or switched impedance) of a first section may be determined (i.e., thickness ratio and/or impedance ratio) using one or more characteristics. In embodiments, a characteristic may include energy output, efficiency, and/or compactness. In embodiments, a thickness ratio (and/or impedance ratio) may be determined including a selected value for one or more characteristics. In embodiments, a thickness ratio (and/or impedance ratio) may be determined including a combination of values for all characteristics of interest.

According to embodiments, a microwave generator may include an increase in unswitched thickness (and/or unswitched impedance) from a first section to an output section, for example a monotonic increase. In embodiments, a monotonic increase may reference an increasing function and/or a non-decreasing function. In embodiments, a monotonic increase may include a linear increase in an unswitched thickness (and/or unswitched impedance) relative to a section number. In embodiments, a monotonic increase may include a power curve increase in an unswitched thickness (and/or unswitched impedance) relative to a section number, for example where a power curve exponent may include values in a range smaller than 1 or larger than 1. In embodiments, a monotonic increase may include an exponential increase in an unswitched thickness (and/or unswitched impedance) relative to a section number.

According to embodiments, an increase in unswitched thickness (and/or unswitched impedance) may be determined using one or more characteristics. In embodiments, a characteristic may include energy output, efficiency, and/or compactness. In embodiments, an increase in unswitched thickness (and/or unswitched impedance) may be determined including a selected value for one or more characteristics. In embodiments, an increase in unswitched thickness (and/or unswitched impedance) may be determined including a combination of values for all characteristics of interest.

According to embodiments, a plurality of connected sections may be connected in a folded configuration. In embodiments, a folded configuration may include folding at an upper conductor and/or at a lower conductor. In embodiments, folding may occur at a switched thickness (and/or switched impedance) and/or unswitched thickness (and/or unswitched impedance). In embodiments, folding may occur from a first section to an output section of a plurality of connected sections. In embodiments, folding may occur in a majority of sections of a plurality of connected sections. In embodiments, folding may occur in an equal number of a plurality of connected sections relative to unfolded sections. In embodiments, folding may occur in some sections of a plurality of connected sections.

According to embodiments, a microwave generator may be configured to connect to a load at one or more ends of a plurality of connected sections. In embodiments, a load may include radiators and/or antennas.

Embodiments relate to methods of generating microwaves. According to embodiments, a method of operating a microwave generator to generate microwaves may include sequentially activating each, switch in a plurality of connected sequential sections, for example starting at the switch in a first section and ending at a switch in the output section. In embodiments, microwave pulses may be generated from a plurality of connected sections into uninterrupted transmission lines which may carry a digital signal in a desired direction. In embodiments, the signal is not required to propagate through more than one closed switch. In embodiments, each intermediate conductor may be charged to a different polarity and/or voltage, for example relative to adjacent sections. In embodiments, each intermediate conductor may be charged to the same and/or substantially the same polarity and/or voltage, for example relative to adjacent sections. In embodiments, sequentially activating switches from back to front along the pairs of transmission lines may discharge each intermediate conductor into continuous transmission lines. In embodiments, switching timing may be selected to generate a microwave signal, for example having maximized power and/or frequency. In embodiments, the switching timing of each subsequent section from the first section to the output section may be delayed by $3\tau$.

Embodiments relate to a method to select and/or determine a plurality of parameters for a microwave generator, for example a microwave generator including a plurality of connected sequential sections in cascade having a first section and/or an output section. In embodiments, a method to select and/or determine a plurality of parameters may include determining, for example for a selected number of total sections, a ratio between an unswitched thickness (and/or unswitched impedance) and a switched thickness (and/or switched impedance) of an output section to a unswitched thickness (and/or unswitched impedance) and a switched thickness (and/or switched impedance) of a first section. In embodiments, a method to select and/or determine a plurality of parameters may include determining, for example for a selected number of total sections, an increase in unswitched thickness from a first section to an output section. In embodiments, a ratio and/or increase may be determined using one or more characteristics. In embodiments, a microwave generator may be manufactured using one or more determined parameters.

According to embodiments, dissipation may be minimized. In embodiments, power may be maximized. In embodiments, volume may be minimized. In embodiments, impedance changes from one section to another, and/or the rate at which impedance changes, may be selected. In embodiments, total impedance change between at least two sections may be selected. In embodiments, parameters may be determined using one or more characteristics. In embodiments, microwaves may be generated using a device manufactured according to determined parameters.

DRAWINGS

The patent or application file contains at least one drawing executed in color. Copies of this patent or patent application publication with color drawing(s) will be provided by the Office upon request and payment of the necessary fee.

Example FIG. 1 illustrates a microwave generator having a switched thickness (and/or switched impedance) which is substantially the same in at least two sections and an unswitched thickness (and/or unswitched impedance) which is increasing in from a first switched section to a load in accordance with one aspect of embodiments.

Figure 2:
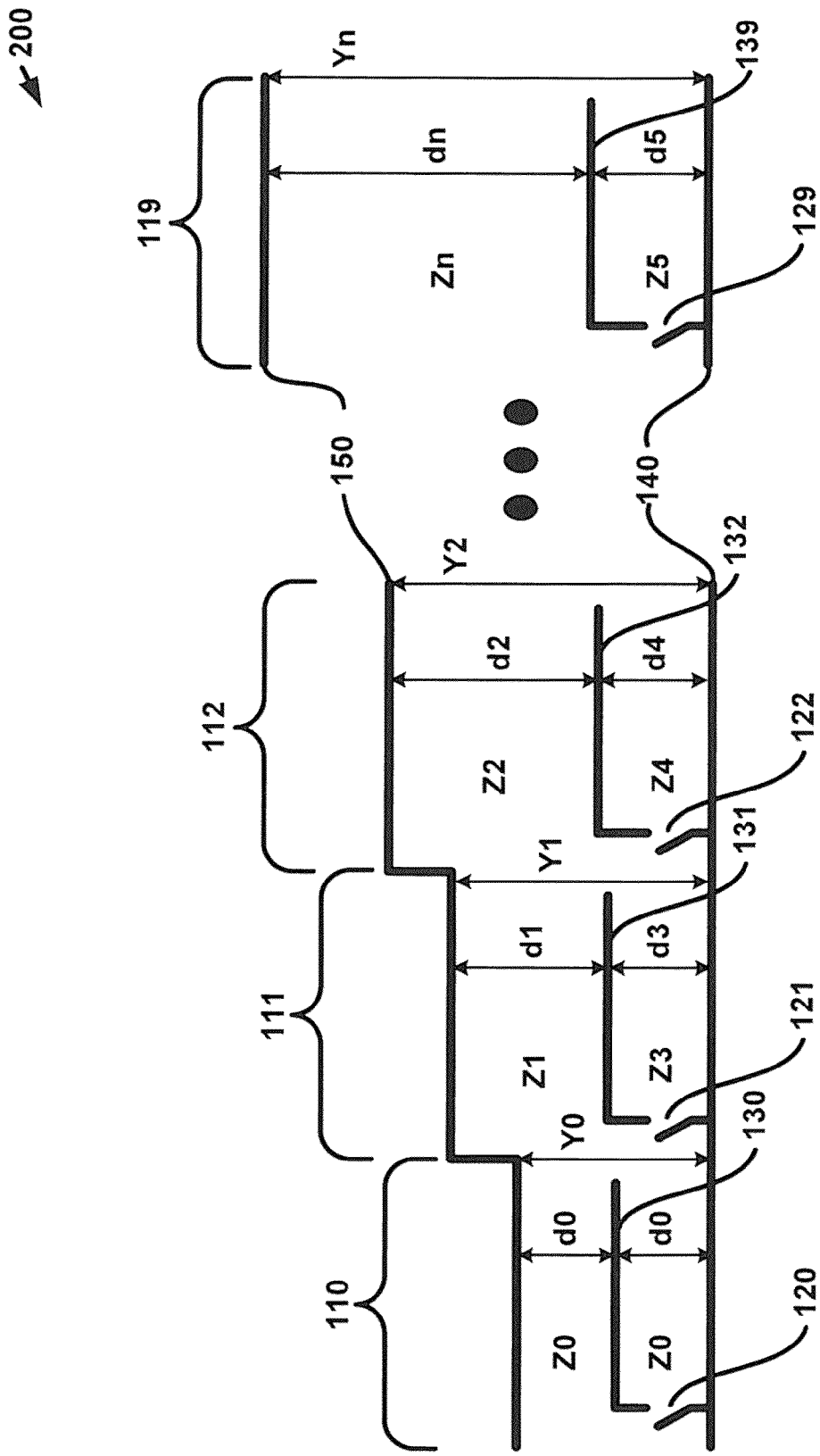

Example FIG. 2 illustrates a microwave generator having a switched thickness (and/or switched impedance) which increases in at least two sections and an unswitched thickness (and/or unswitched impedance) which is increasing from a first switched section to a load in accordance with one aspect of embodiments.

Figure 3:
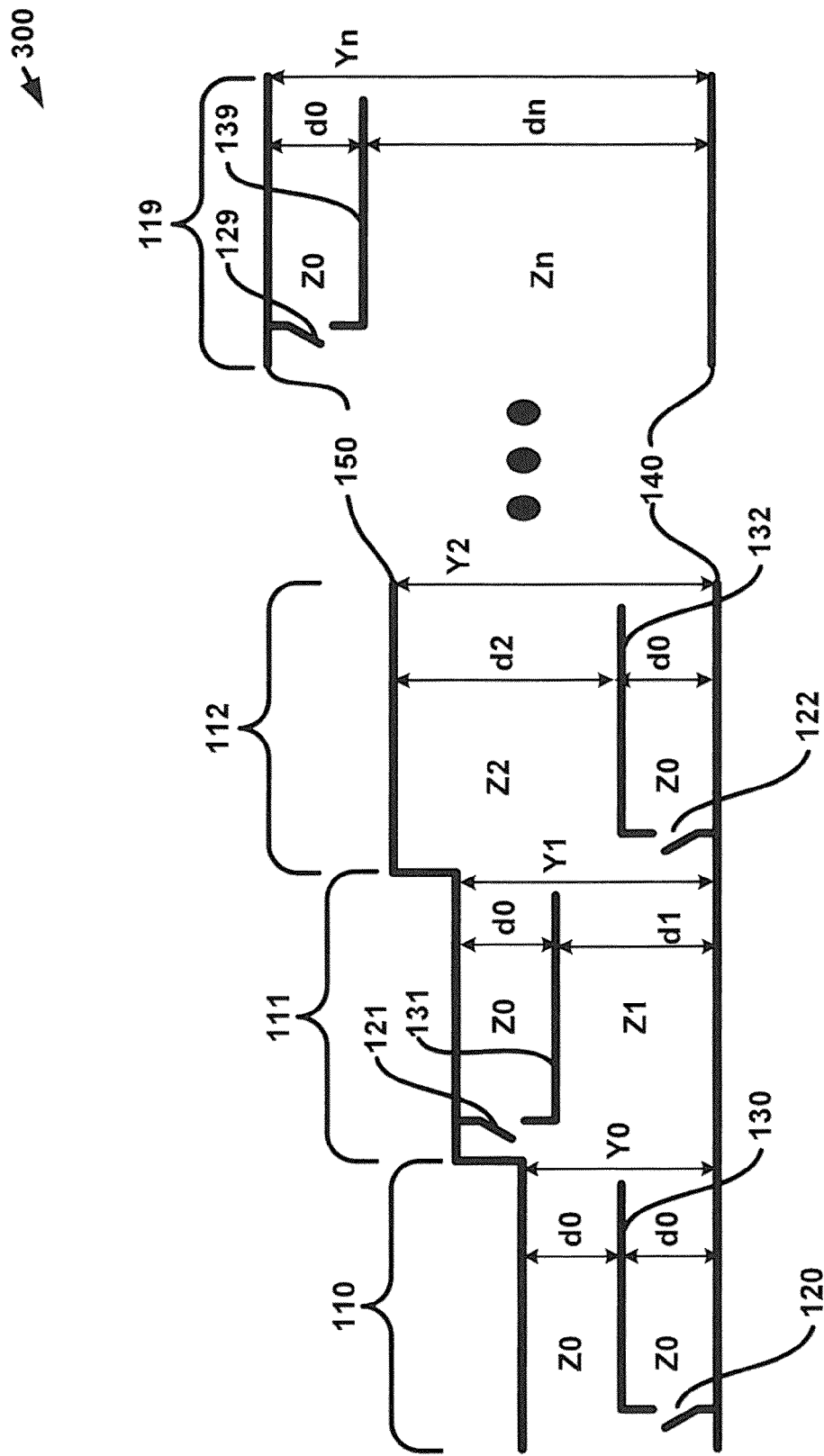

Example FIG. 3 illustrates a microwave generator where the position of the switched thickness is alternating between an upper conductor and a lower conductor in at least two sections in accordance with one aspect of embodiments.

Figure 4:
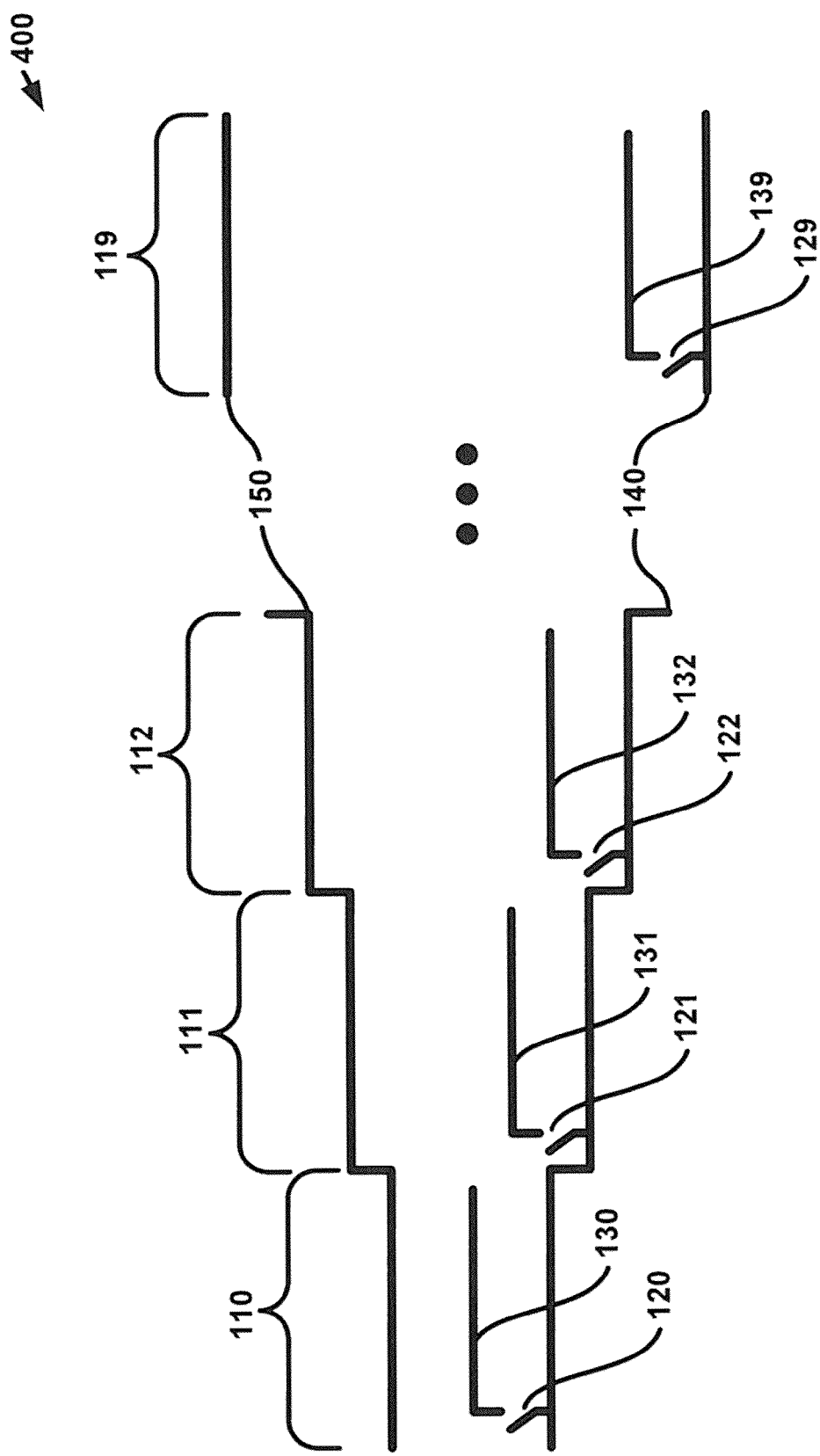

Example FIG. 4 illustrates a microwave generator having an upper conductor and a lower conductor including a stepped configuration where the position of the switched thickness (and/or switched impedance) is adjacent the lower conductor in at least two sections in accordance with one aspect of embodiments.

Figure 5:
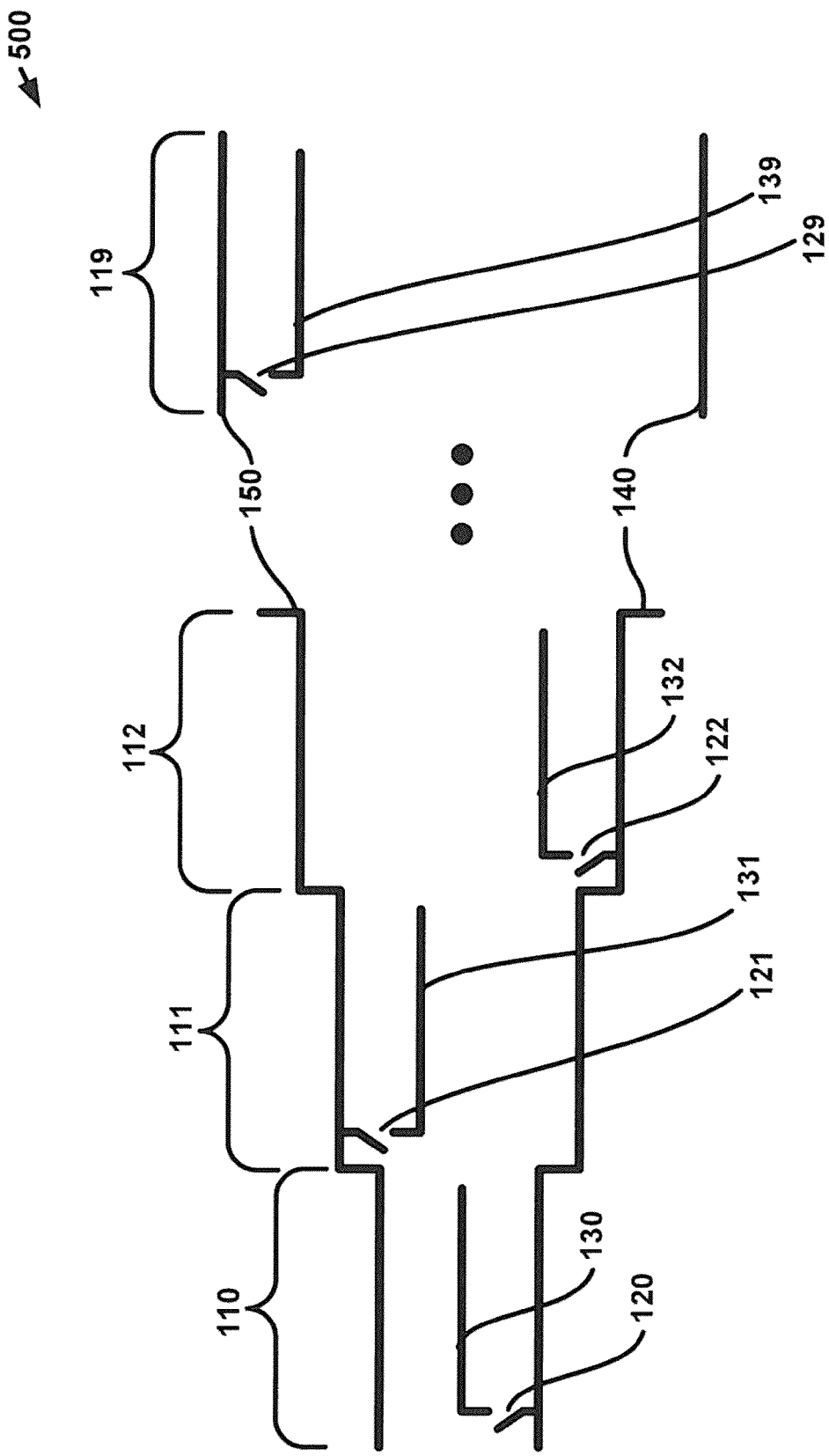

Example FIG. 5 illustrates a microwave generator having an upper conductor and a lower conductor including a stepped configuration where the position of the switched thickness is alternating between an upper conductor and a lower conductor in at least two sections in accordance with one aspect of embodiments.

Figure 6:
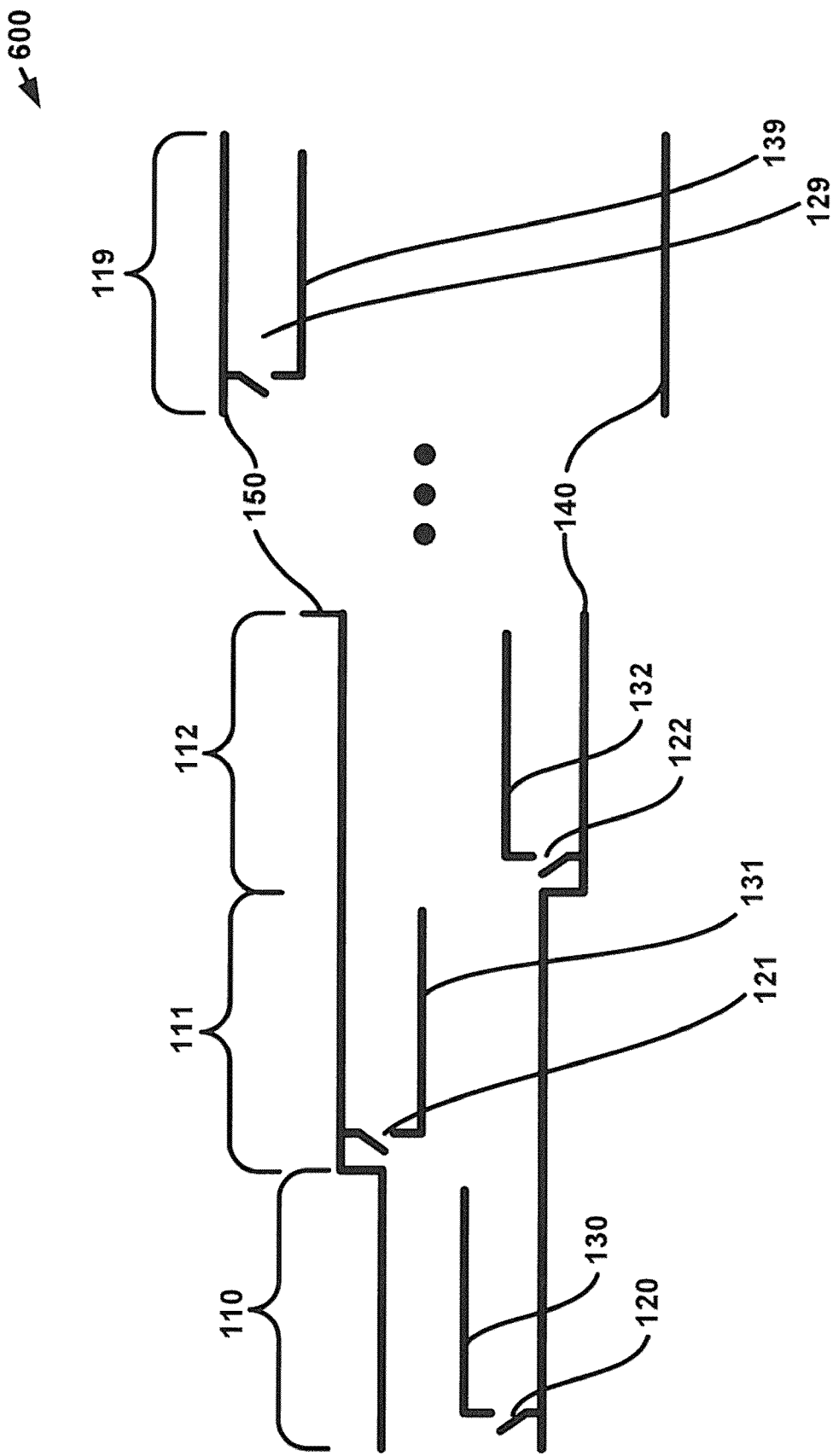

Example FIG. 6 illustrates a microwave generator having an upper conductor and a lower conductor including another stepped configurations in accordance with one aspect of embodiments.

Figure 7:
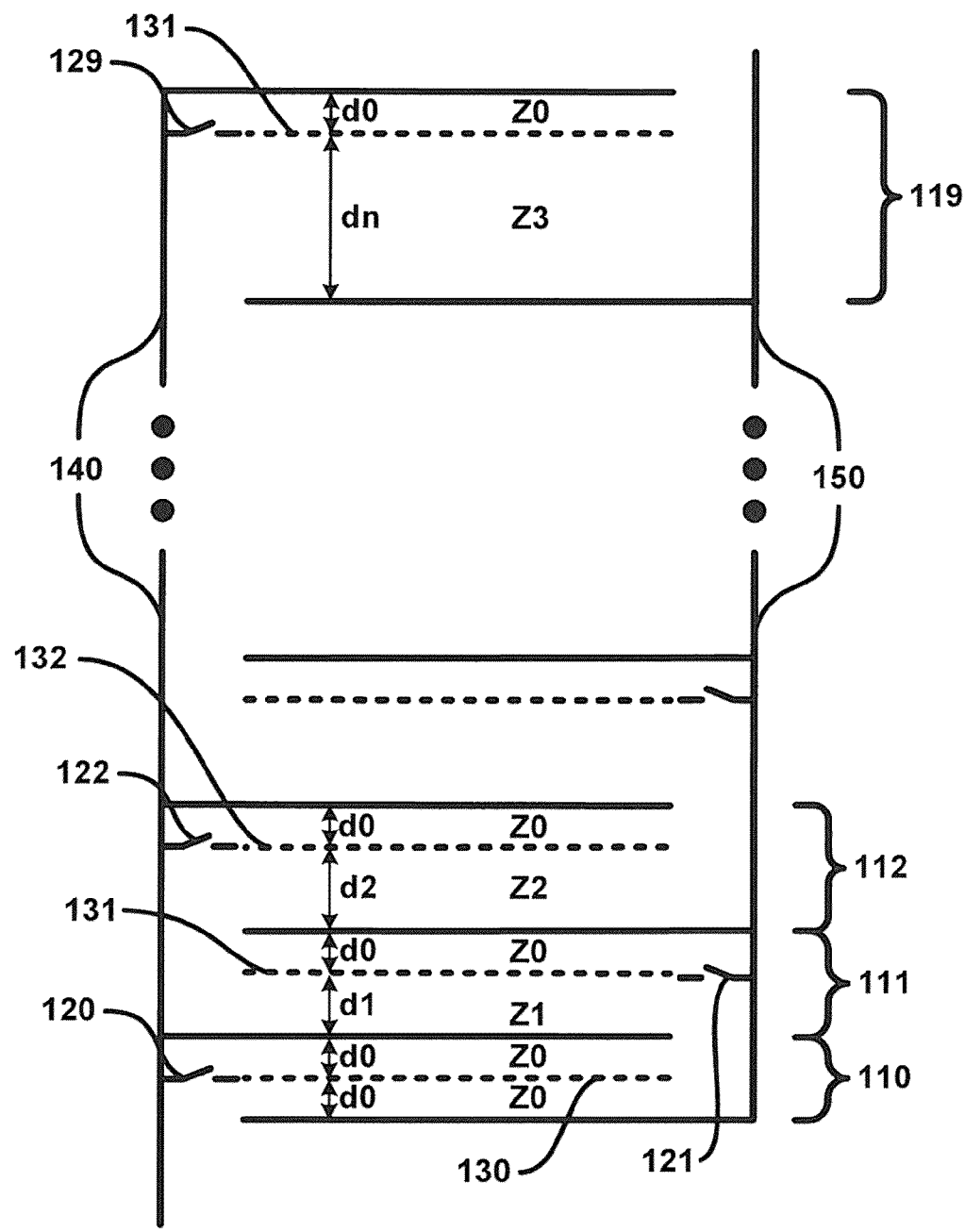

Example FIG. 7 illustrates a microwave generator having a folded configuration in accordance with one aspect of embodiments.

Figure 8:
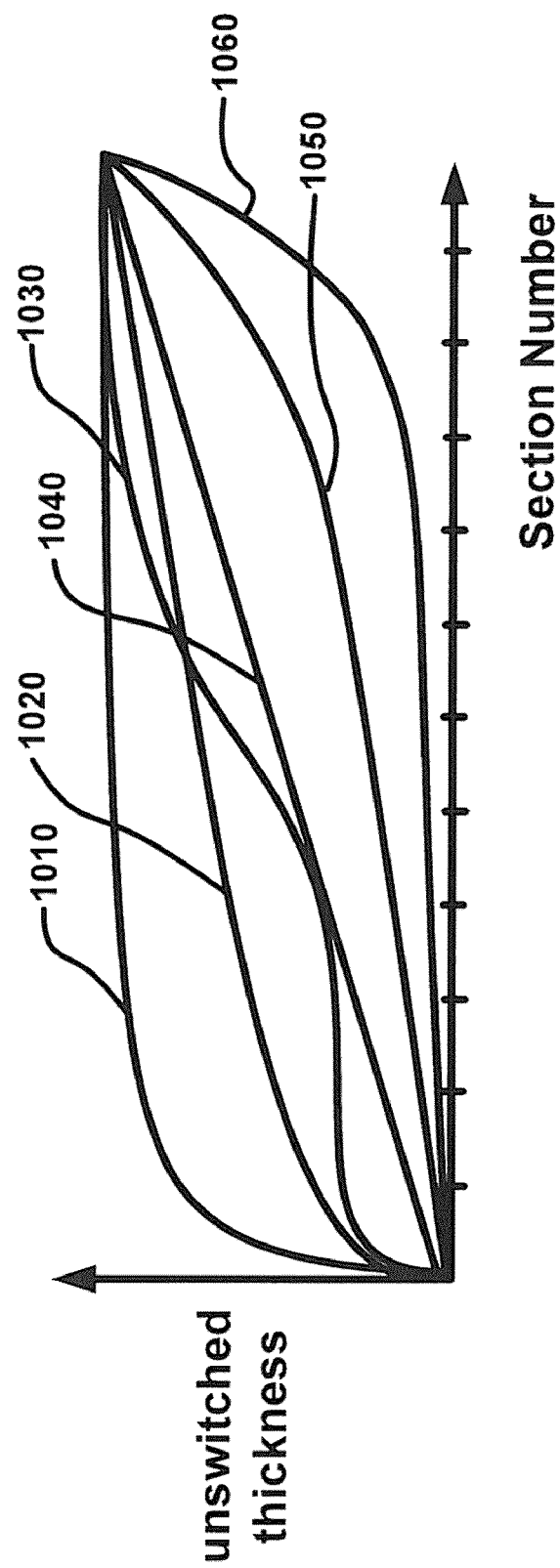

Example FIG. 8 illustrates a graph representing a change in unswitched thickness (and/or unswitched impedance) as a monotonic function relative to the section number in accordance with one aspect of embodiments.

Figure 9:
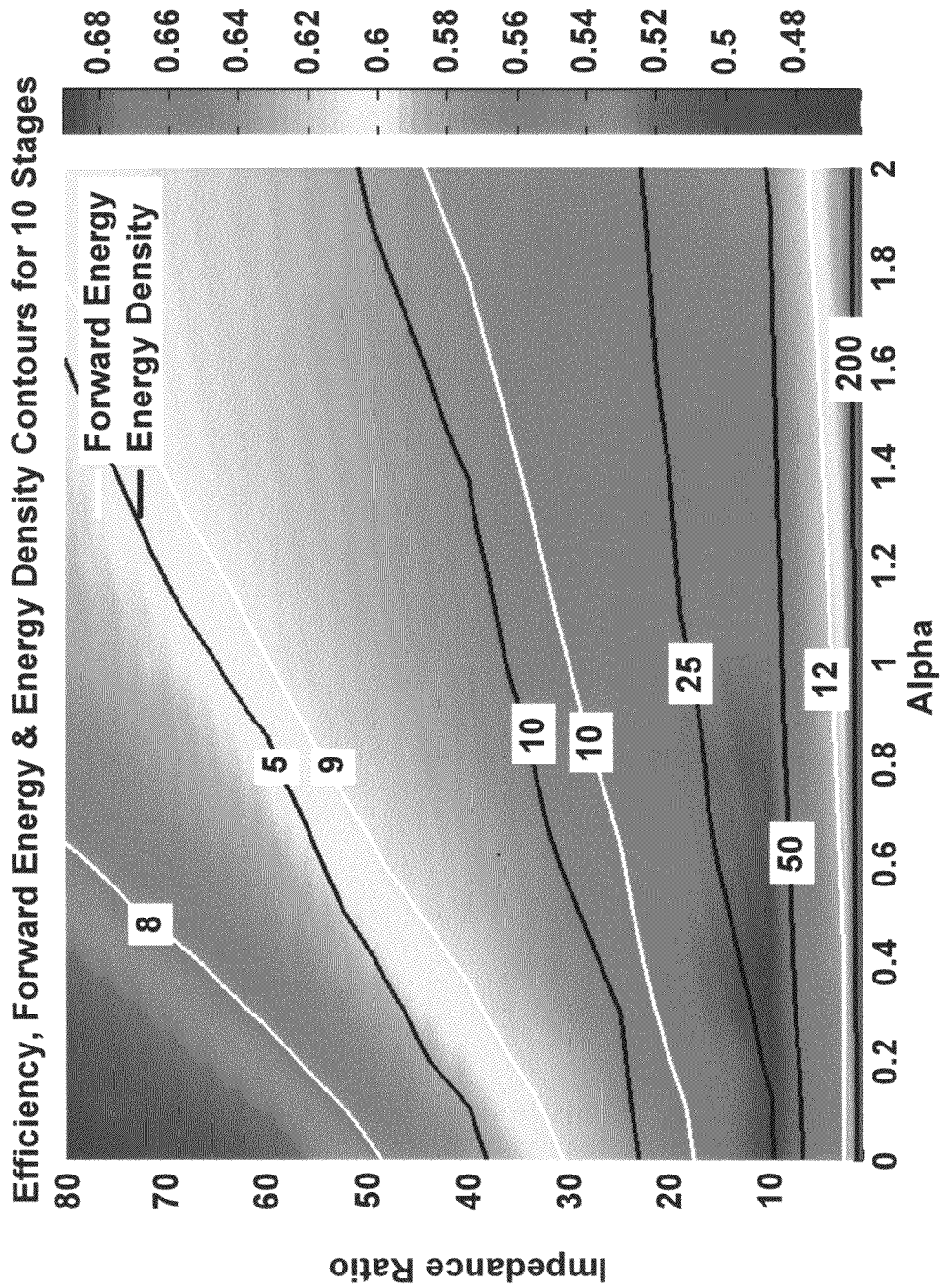
Figure 10:
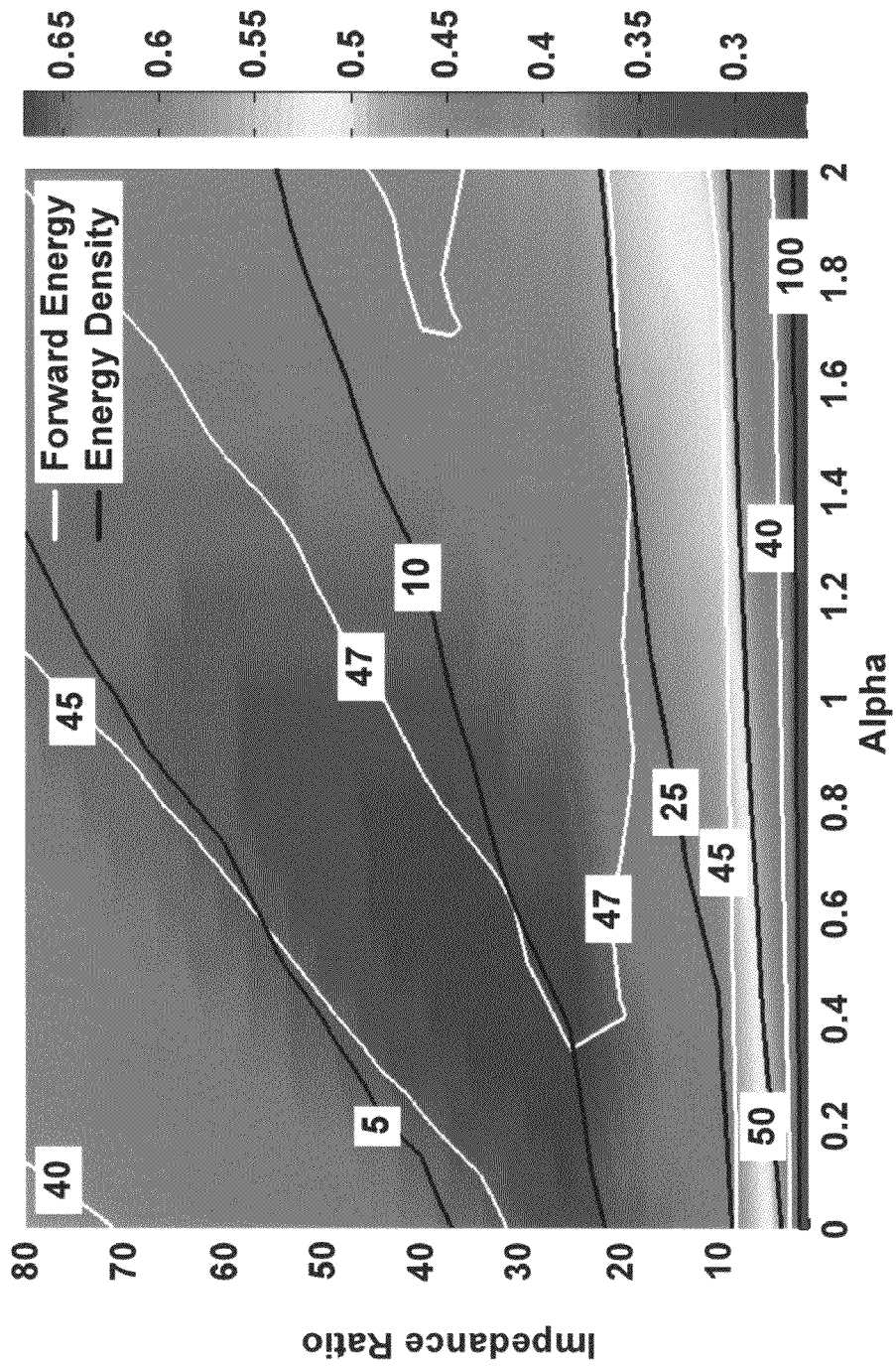
Figure 11:
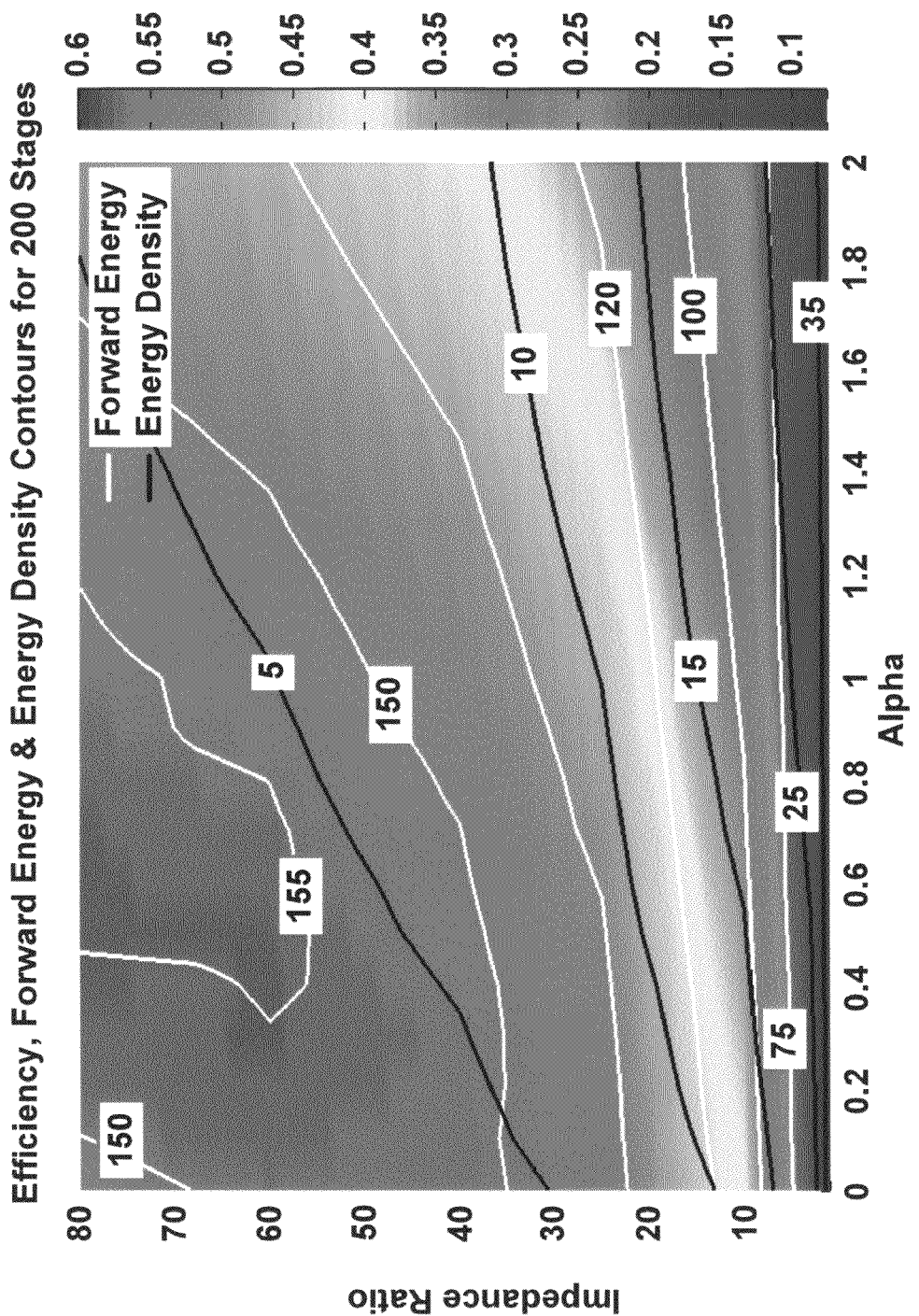

Example FIG. 9 to FIG. 11 illustrates a method to determine the amount of increase and/or manner of increase in unswitched thickness (and/or unswitched impedance) for a different number of total stages for a device to generate microwaves in accordance with one aspect of embodiments.

Figure 12:
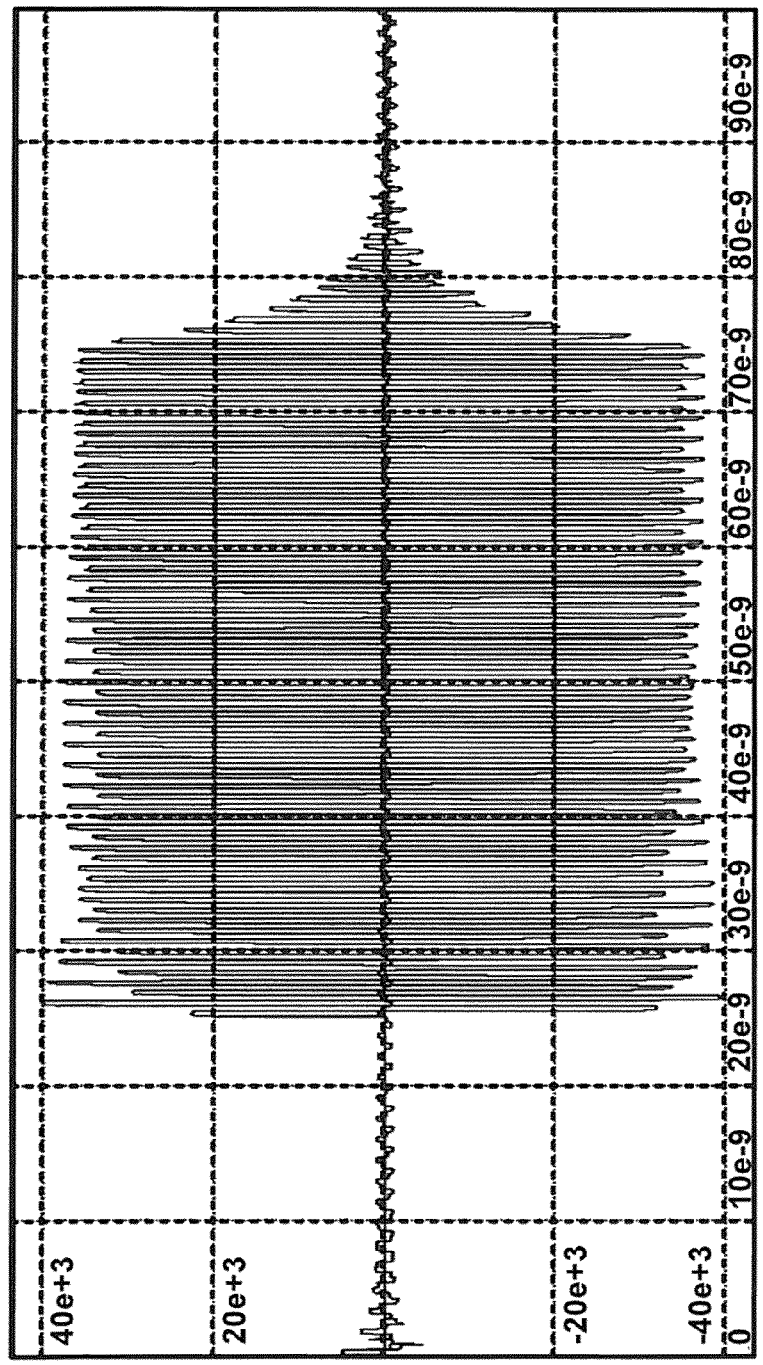

Example FIG. 12 illustrates an output of a microwave generator having 130 stages in accordance with one aspect of embodiments.

DESCRIPTION

Embodiments relate to electric and/or electronic devices, and methods thereof. Some embodiments relate to digital synthesis of signals. According to embodiments, microwaves may be generated. In embodiments, a microwave generator may include a plurality of connected sections. Referring to example FIG. 1, microwave generator 100 may include a plurality of connected sections, for example sections 110, 111, 112 . . . 119. In embodiments, a microwave generator 100 may include a plurality of connected sequential sections in cascade. As illustrated in one aspect of embodiments in FIG. 1, a plurality of sections may be sequentially connected in cascade, for example section 110, 111, 112 . . . 119 sequentially connected in cascade. In embodiments, the number of cycles of an output signal may be selected, for example determined by the total number of sections of a plurality of connected sections. In embodiments, the length of a section may be selected, for example based on the desired frequency of microwaves to be generated. In embodiments, the length of each of a plurality of connected sections may be selected to be a quarter wavelength.

According to embodiments, one or more connected sections may include an intermediate conductor, an upper conductor and/or a lower conductor. As illustrated in one aspect of embodiments in FIG. 1, sections 110, 111, 112 . . . 119 may include intermediate conductor 130, 131, 132 . . . 139 respectively. In embodiments, sections 110, 111, 112 . . . 119 may include upper conductor 150 and lower conductor 140. In embodiments, an intermediate conductor, upper conductor and/or a lower conductor may include any suitable material that can be charged. In embodiments, for example a material that may be electrically charged may include a metal material, such as copper. In embodiments, the thickness of a metal material may be relatively thin, for example approximately 1.4 mil.

According to embodiments, a microwave generator may have any desired configuration. In embodiments, for example, a microwave generator (e.g. 100, 200 and 300) may have a substantially planar configuration on one side as illustrated in one aspect of embodiments in FIG. 1 to FIG. 3. In embodiments, a microwave generator (e.g. 100, 200, 300, 400, 500 and 600) may have a stepped configuration as illustrated in one aspect of embodiments in FIG. 1 to FIG. 6. In embodiments, a microwave generator (e.g. 700) may have a folded configuration as illustrated in one aspect of embodiments in FIG. 7. In embodiments, a folded configuration may include folding at an upper conductor and/or at a lower conductor. In embodiments, folding may occur at a unswitched thickness (and/or unswitched impedance) and/or switched thickness (and/or switched impedance). In embodiments, folding may occur from a first section to an output section of a plurality of connected sections. In embodiments, folding may occur in a majority of sections of a plurality of connected sections. In embodiments, folding may occur in an equal number of a plurality of connected sections relative to unfolded sections. In embodiments, folding may occur in some sections of a plurality of connected sections.

According to embodiments, a microwave generator may include an isolating material. In embodiments, one or more connected sections may include a first isolating material having a first thickness (and/or first impedance) connected between an intermediate conductor and an upper conductor. As illustrated in one aspect of embodiments in FIG. 1, sections 110, 111, 112 . . . 119 of microwave generator 100 may include a first isolating material having first thickness d0, d1, d2 . . . dn (and/or first impedance Z0, Z1, Z2 . . . Zn), respectively, connected between intermediate conductor 130, 131, 132 . . . 139, respectively, and upper conductor 150. In embodiments, one or more connected sections may include a second isolating material having a second thickness (and/or second impedance) connected between an, intermediate conductor and an lower conductor. As illustrated in one aspect of embodiments in FIG. 1, sections 110, 111, 112 . . . 119 of microwave generator 100 may include a second isolating material having second thickness d0, d1, d2 . . . dn, respectively, (and/or first impedance Z0, Z1, Z2 . . . Zn), respectively, connected between intermediate conductor 130, 131, 132 . . . 139 and lower conductor 140.

According to embodiments, an isolating material may include any suitable material that can insulate electric charge. In embodiments, for example, a material that can insulate electric charge may include a dielectric material, such as polymers and/or oxides. In embodiments, isolation material may include Kapton. In embodiments, the thickness of an isolation material may be relatively thin, for example approximately 2 mil. In embodiments, a first isolating material may be different, the same and/or substantially the same as a second isolating material.

According to embodiments, a microwave generator may include a switch. In embodiments, one or more connected sections may include a switch. In embodiments, any switch may be included, for example, spark gaps, electrically triggered semiconductor switches, and other devices capable of command switching. In embodiments, a microwave generator may include one or more photoconductive switches. In embodiments, a switch may have any desired shape for example a trapezoidal shape. In embodiments, one or more sidewalls of a switch may be curved. In embodiments, one or more sidewalls of a switch may have any shape which may maximize voltage holding, minimize inductance, and/or minimize an electric field between a switch and a switched thickness.

According to embodiments, two opposing sides of a photoconductive switch may include a conductive layer. In embodiments, a conductive layer may include one or more openings, such that light may pass through the conductive layer to the switch which may include semiconductor material. In embodiments, a conductive layer including one or more openings may have any suitable configuration, for example a grid configuration.

In embodiments, a switch may be mounted on and/or over any suitable substrate, for example a substrate which may carry current. In embodiments, a substrate may include a metal material, for example in bulk and/or as a coating. In embodiments, a substrate may be an intermediate conductor. In embodiments, one or more sidewalls of a substrate may be curved. In embodiments, one or more sidewalls of a substrate may have any shape which may maximize voltage holding, minimize inductance, and/or minimize an electric field between a switch and a switched thickness.

According to embodiments, a switch may be mounted on and/or over a substrate in any suitable configuration, for example a configuration which maximizes voltage holding, folding and/or minimizes rise time. In embodiments, a switch may be mounted on and/or over a substrate such that a conductive layer of the switch is bonded to the substrate. In embodiments, a conductive layer of a switch including one or more openings may be connected to a lower conductor of a microwave generator.

According to embodiments, a switched thickness may be parallel to the substrate and perpendicular to the conductive layers of the switch. In embodiments, a portion of a switched thickness may be curved, for example relative to a sidewall of the switch. In embodiments, a switched thickness may have any shape which may maximize voltage holding, minimize inductance, and/or minimize an electric field between a switch and a switched thickness.

According to embodiments, there may be a filler, such as a polymer filler, disposed between a sidewall of a switch and the switched thickness. In embodiments, there may be a filler between a sidewall of the switch and an unswitched thickness. In embodiments, a filler may be a polyimide filler. In embodiments, a switched thickness may have any shape which may minimize the amount of a filler.

According to embodiments, a microwave generator may be configured for a switch in each subsequent section among a plurality of connected sections to be switched sequentially, for example from a first section to an output section. Referring back to FIG. 1, for example, switch 120 of section 110 may be activated first, followed by switches 121, 122 . . . 129 of respective sections 110, 111, 112 . . . 119 in a sequential order. In embodiments, timing of the switching may be selected. In embodiments, the switching timing of each subsequent section may be delayed by 3τ, where τ may reference the transit time of the line switched first. Referring to FIG. 1, for example, switch 120 of section 110 may be activated first, and switch 121 of section 111 may then be activated after a period of delay, for example 3τ.

According to embodiments, a switch may be connected between an intermediate conductor and a lower conductor. As illustrated in one aspect of embodiments in FIG. 1, switches 120, 121, 122 . . . 129 of respective sections 110, 111, 112 . . . 119 may be connected between respective intermediate conductor 130, 131, 132 . . . 139 and lower conductor 140. In embodiments, a switch may be connected between an intermediate conductor and an upper conductor. As illustrated in one aspect of embodiments in example FIG. 3, switches 121 and 129 of respective sections 111 and 119 may be connected between respective intermediate conductor 131, 139 and upper conductor 150.

According to embodiments, a switch may be connected between an intermediate conductor and an upper conductor or a lower conductor in a majority of a plurality of connected, sections. A majority may refer to approximately 51% of connected sections. As shown in one aspect of embodiments in FIG. 1, for example deleting the symbol " . . . " which may reference one or more sections in any configuration and directly connecting sections 112 and 119 for purposes of illustration, a microwave generator may have a majority (e.g., 100%) of sections 110, 111, 112 and 119 including respective switches 120, 121, 122 and 129 connected between respective intermediate conductors 130, 131, 132 and 139 and lower conductor 140. Any configuration may be selected. As illustrated in one aspect of embodiments in FIG. 3, for example directly connecting sections 110, 111 and 119 for the purposes of illustration, a microwave generator may have a majority of, sections 111 and 119 (e.g. approximately 66.6%) including respective switches 121 and 129 connected between respective intermediate conductors 131, 139 and upper conductor 150.

According to embodiments, switches in an equal number of a plurality of connected sections may be connected between an intermediate conductor and an upper conductor and between an intermediate conductor and a lower conductor. As shown in one aspect of embodiments in FIG. 1, for example letting the symbol " . . . " represent four consecutive sections having respective switches connected between respective intermediate conductors and, conductor 150 for illustrative purposes, switches in the front four sections would be connected between an intermediate conductor and lower conductor 140 and switches in final four sections would be connected between an intermediate conductor and upper conductor 150. Any configuration may be selected to yield an equal and/or an unequal number, for example a majority.

According, to embodiments, switches in adjacent, sections of a majority of a plurality of connected sections may be alternately connected, for example between an intermediate conductor and an upper conductor and/or an intermediate conductor and a lower conductor. As illustrated in one aspect of embodiments in FIG. 3, for example deleting the symbol " . . . " and directly connecting sections 112 and 119 for purposes of illustration, microwave generator 200 may have a majority (e.g., 100%) of adjacent sections 110, 111, 112 and 119 including respective switches 120, 121, 122 and 129 alternately connected between respective intermediate conductors 130, 131, 132 and 139 and respective conductors 140 and 150. Such a configuration may also illustrate an embodiment of switches in an equal number of a plurality of connected sections connected between an intermediate conductor and an upper conductor and an intermediate conductor and a lower conductor.

According to embodiments, a switch in some sections of a plurality of connected sections may be alternately connected between an intermediate conductor and an upper conductor and an intermediate conductor and a lower conductor. As illustrated in one aspect of embodiments in FIG. 1 to FIG. 3, for example letting the symbol " . . . " of FIG. 1 represent sections having the alternating configurations similar to sections 111 and 112 of FIG. 3, a microwave generator could be selected to have some sections with switches alternately connected. It is noted that such a selected configuration may illustrate an embodiment of a majority and/or minority. For example, a minority with respect to switch position relative to conductor 150 (and/or a minority with respect to alternately connected switches in adjacent sections) and/or a majority with respect to switch position relative to conductor 140.

According to embodiments, a first thickness (and/or first impedance) of a first isolating material may be a switched thickness (and/or a switched impedance), and/or a second thickness (and/or second impedance) of a second isolating material may be an unswitched thickness (and/or an unswitched impedance). As illustrated in one aspect of embodiments in FIG. 3, first thickness d0 (and/or first impedance Z0) of section 111 and/or first thickness d0 (and/or first impedance 70) of section 119 may be a switched thickness, such that second thickness d1 (and/or second impedance Z1) of section 111 and/or second thickness dn (and/or second impedance Zn) may be an unswitched thickness.

According to embodiments, a second thickness (and/or second impedance) of a second isolating material may be a switched thickness (and/or a switched impedance), and/or a first thickness (and/or first impedance) of a first isolating material may be an unswitched thickness (and/or an unswitched impedance). Referring back to FIG. 1, as illustrated in one aspect of embodiments, second thickness d0 (and/or second impedance Z0) of sections 110, 111, 112 . . . 119 of respective isolating material may be a switched thickness. In embodiments, first thickness d0 (and/or first impedance Z0) of section 110 (between center conductor 130 and upper conductor 150) may be an unswitched thickness. In embodiments, second thickness d1 (and/or second impedance Z1) of section 111, second thickness d2 (and/or second impedance Z2) of section 112, and second thickness dn (and/or second impedance Zn) of section 119 may be an unswitched thickness.

According to embodiments, a microwave generator may include a plurality of connected sections having a first section and/or an output section. Referring to FIG. 1 to FIG. 7, section 110 may be a first section and section 119 may be an output section for plurality of sections 110, 111, 112 . . . 119. In embodiments, an unswitched thickness (and/or unswitched impedance) of an output section may be larger than an unswitched thickness (and/or unswitched impedance) of a first section. As illustrated in one aspect, of embodiments in FIG. 1 to FIG. 2 and FIG. 7, unswitched thickness d0 (and/or unswitched impedance Z0) of section 110 (i.e., between center conductor 130 and upper conductor 150) is less than unswitched thickness dn (and/or unswitched impedance Zn) of section 119.

According to embodiments, a microwave generator may include a ratio between an unswitched thickness (and/or unswitched impedance) and a switched thickness (and/or switched impedance) of an output section to an unswitched thickness (and/or unswitched impedance) and a switched thickness (and/or switched impedance) of a first section. As illustrated in one aspect of embodiments in FIG. 1 to FIG. 3 and FIG. 7, there may be a thickness ratio (and/or impedance ratio) Yn/Y0. As illustrated in one aspect of embodiments in FIG. 1, there may be a may be a thickness ratio $(dn/d0)/(d0/d0)$ and/or impedance ratio $(Zn/Z0)/(Z0/Z0)$. As illustrated in one aspect of embodiments in FIG. 2, there may be a may be a thickness ratio $(dn/d5)/(d0/d0)$ and/or impedance ratio $(Zn/Z5)/(Z0/Z0)$. Any thickness ratio (and/or impedance ratio) may be selected, for example for a selected number of total sections, which may be derived, arbitrary and/or assigned.

According to embodiments, a microwave generator may include an increase in unswitched thickness (and/or unswitched impedance) from a first section to an output section. In embodiments, an increase in unswitched thickness (and/or unswitched impedance) may be a monotonic increase. In embodiments, a monotonic increase may reference an increasing function and/or a non-decreasing function. Referring to example FIG. 8, a graph illustrates a change in unswitched thickness (and/or unswitched impedance) as a monotonic function relative to the section number in accordance with one aspect of embodiments. The y-axis represents unswitched thickness (and/or unswitched impedance) of a connected section and the x-axis represents the section number.

According to embodiments, a monotonic increase may include a linear increase in unswitched thickness (and/or unswitched impedance) relative to a section number, for example moving from section to section toward a load. As illustrated in one aspect of embodiments in FIG. 8, monotonic increase 1040 includes a linear increase in unswitched thickness (and/or unswitched impedance) relative to a section number. For example, if the section number is n, then the monotonic function increases according to $n^1$, where the integer 1 yields a substantially constant increase from section to section, for example moving from a first section to an output section. In embodiments, the exponent of n may refer to alpha.

According to embodiments, a monotonic increase may include a power curve increase in an unswitched thickness (and/or unswitched impedance) relative to a section number, for example moving from section to section toward a load. In embodiments, a power curve exponent may include values in a range larger than 1. As illustrated in one aspect of embodiments in FIG. 8, monotonic increase 1050 includes a power curve increase in unswitched thickness (and/or unswitched impedance) relative to a section number. For example, if the section number is n, then the monotonic function increases according to $n^2$, where the integer 2 yields a relatively slow initial increase in unswitched thickness (and/or unswitched impedance) followed by a progressively faster increase in unswitched thickness (and/or unswitched impedance) from section to section, for example moving from a first section to an output section.

According to embodiments, a power curve exponent may include values in a range smaller than 1. As illustrated in one aspect of embodiments in FIG. 8, monotonic increase 1020 includes a power curve increase in unswitched thickness (and/or unswitched impedance) relative to a section number. For example, if the section number is n, then the monotonic function increases according to $n^{1/2}$ where the integer ½ yields a relatively fast initial increase in unswitched thickness (and/or unswitched impedance) followed by a progressively slower increase in unswitched thickness (and/or unswitched impedance) from section to section, for example moving from a first section to an output section.

According to embodiments, a monotonic increase may include an exponential increase in an unswitched thickness (and/or unswitched impedance) relative to a section number, for example moving from section to section toward a load. In embodiments, a constant such as e raised to a variable would yield a monotonic increase. As illustrated in one aspect of embodiments, in FIG. 8, monotonic increase 1010, 1060 includes an exponential increase in unswitched thickness (and/or unswitched impedance) relative to a section number. For example, if an exponential increase were determined to be $e^n$, the monotonic increase 1060 would yield a relatively slow initial increase in unswitched thickness (and/or unswitched impedance) followed by a progressively faster increase in unswitched thickness (and/or unswitched impedance) from, section to section, for example moving from a first section to an output section. If an exponential increase were determined to be $e^{-n}$, the monotonic increase 1010 would yield a relatively fast initial increase in unswitched thickness (and/or unswitched impedance) followed by a progressively slower increase in unswitched thickness (and/or unswitched impedance) from section to section, for example moving from a first section to an output section.

According to embodiments, any monotonic increase in unswitched thickness (and/or unswitched impedance) may be selected and/or employed. In embodiments, for example, monotonic increase 1030 illustrates a relatively fast initial increase in unswitched thickness (and/or unswitched impedance) followed by period of non-decrease in unswitched thickness (and/or unswitched impedance), and ending with a period of relatively slow increase in unswitched thickness (and/or unswitched impedance).

Referring to FIG. 1, a monotonic increase is illustrated in accordance with one aspect of embodiments. In embodiments, each sequentially connected section exhibits a monotonically increasing unswitched thickness (and/or unswitched impedance), for example moving in the direction toward a load. As illustrated in one aspect of embodiments in FIG. 1, unswitched thickness d2 (and/or unswitched impedance Z2) of section 112 is larger than unswitched thickness d1 (and/or unswitched impedance Z1) of section 111, and unswitched thickness d1 (and/or unswitched impedance Z1) of section 111 is larger than unswitched thickness d0 (and/or unswitched impedance Z0) of section 110 (i.e., between center conductor 130 and upper conductor 150). In embodiments, if the section number is n, then the value of n of section 110 is 1 if section 110 is a first section, the value of n of section 111 is 2, and the value of n of section 112 is 3. If the exponent of n is 1 (i.e., alpha=1) for section numbers 1-3, then the monotonic function increases according to $n^1$, such that d2>d1>d0 according to one aspect of a linear monotonic increase.

According to embodiments, any monotonic function may be employed. In one aspect of embodiments illustrated in example FIG. 6, for example moving the position of switch 122 and intermediate conductor 132 such that it connects to upper conductor 150 in a similar manner shown in section 111 for the purposes of illustration, there would be a period of on-decreasing unswitched thickness (and/or unswitched impedance) from section 111 to 112, although there would be a monotonic increase unswitched thickness (and/or unswitched impedance), for example from section 110 to 111 and/or 112.

According to embodiments, switched thickness (and/or switched impedance) may change, such that is may be a monotonic increase in unswitched thickness (and/or unswitched impedance). As illustrated in one aspect of embodiments in FIG. 2, unswitched thickness d2 (and/or unswitched impedance Z2) of section 112 is larger than unswitched thickness d1 (and/or unswitched impedance Z1) of section 111 In embodiments, switched thickness d4 (and/or switched impedance Z4) of section 112 is larger than switched thickness d3 (and/or switched impedance Z3) of section 111. In embodiments, switched thickness may change in any manner, for example increase, decrease, and/or may remain substantially and yield a monotonic increase in unswitched thickness (and/or unswitched impedance).

According to embodiments, a ratio between an unswitched thickness (and/or unswitched impedance) and a switched thickness (and/or switched impedance) of an output section to a unswitched thickness (and/or unswitched impedance) and a switched thickness (and/or switched impedance) of a first section may be selected and/or determined (i.e., thickness and/or impedance ratio). In embodiments, an increase in unswitched thickness (and/or unswitched impedance) from a first section to an output section may be selected and/or determined. In embodiments, the thickness ratio (and/or unswitched impedance ratio) and/or an increase in unswitched thickness (and/or unswitched impedance) may represent parameters. In embodiments, a thickness ratio (and/or impedance ratio) and/or a monotonic increase in unswitched thickness (and/or unswitched impedance) may be selected and/or determined using one or more characteristics.

According to embodiments, a characteristic may include energy output, efficiency, and/or compactness, as illustrated in one aspect of embodiments by a colored contour map in example FIG. 9 to FIG. 11 for a 1 meter wide system. In embodiments, a characteristic may include efficiency, forward energy (e.g. energy generated) and/or energy density (e.g., source compactness). In embodiments, a characteristic may include any characteristic of interest, for example impedance of an output load, power output and/or output waveform. In embodiments, any suitable representation illustrating characteristic values, for example efficiency, forward energy and/or energy density relative to parameter values, for example thickness ratio (and/or impedance ratio) and/or increase in unswitched thickness (and/or unswitched impedance) may be employed.

Referring to FIG. 9 to FIG. 11, a thickness ratio (and/or impedance ratio) of 80 may represent that an unswitched thickness (and/or unswitched impedance) and a switched thickness (and/or switched impedance) of an output section is 80 times larger than the unswitched thickness (and/or unswitched impedance) and a switched thickness (and/or switched impedance) of a first section. Referring to FIG. 1 and FIG. 9, for example, (dn/d0) (and/or (Zn/Z0)) of section 110 may be 80 times larger than d0/d0 (and/or (Z0/Z0)) of section 110, when section 110 is a first section and section 119 is an output section. In embodiments, any magnitude of ratio may be used, for example over 80.

Referring to back to FIG. 9 to FIG. 11, alpha=1 may represent a monotonic increase in unswitched thickness (and/or unswitched impedance). Referring to FIG. 8 and FIG. 9, for example, if an exponent of n is equal to 1 (e.g., alpha=1), there may be a substantially constant increase from section to section, for example moving from a first section to an output section.

As illustrated in one aspect of embodiments, a thickness ratio (and/or impedance ratio) and/or a increase in unswitched thickness (and/or unswitched impedance) may be determined using one or more characteristics. In embodiments, for example when a characteristic of interest includes efficiency, forward energy (e.g., energy generated) and/or energy density (e.g., compactness), a thickness ratio (and/or impedance ratio) and/or a increase in unswitched thickness (and/or unswitched impedance) may be determined using one or more of the characteristics, which may include all of the characteristics. Referring to back FIG. 9, the forward energy is relatively high for a 10 stage system (e.g., 10 sections) in the regime where alpha is approximately equal to 1 and thickness ratio (and/or impedance ratio) is approximately equal to 2, for example 12. In this regime, there are other characteristic values that may be of interest, for example compactness at a value between approximately 50 and 200 and efficiency at a value between approximately 0.6 and 0.64. If the characteristic of interest is only the forward energy, the thickness ratio (and/or impedance ration) and/or increase in unswitched thickness (and/or unswitched impedance) may be determined irrespective of other characteristic values.

As illustrated in one aspect of embodiments in FIG. 9, the efficiency is relatively high in the regime where alpha is approximately equal to 0.4 and thickness ratio (and/or impedance ratio) is approximately equal to 10, for example relatively redder (i.e., above 0.68 in scale). In this regime, there are other characteristic values which may be of interest, for example compactness at a value between approximately 25 and 50 and forward energy between approximately 10 and 12. In embodiments, if the characteristic of interest is only efficiency, the thickness ratio (and/or impedance ratio) and/or increase in unswitched thickness (and/or unswitched impedance) may be determined irrespective of other characteristic values.

According to embodiments, a thickness ratio (and/or impedance ratio) and/or an increase in unswitched thickness (and/or unswitched impedance) may be determined including a combination of values for characteristics of interest. In embodiments, where there are a combination of characteristics of interest, for example the efficiency and the forward energy, a weight may be applied to one or more characteristics such that the thickness ratio (and/or impedance ration) and/or increase in unswitched thickness (and/or unswitched impedance) may be determined for the combination of characteristics. For example, if the efficiency is at a higher priority than any other characteristic, a larger weight may be assigned to efficiency than any other characteristic.

According to embodiments, for example if maximizing the combination of all of the characteristics is a priority, weighing the relative changes in one or more characteristic values relative to each other may be employed to determine and/or select parameters. For example, referring to FIG. 9, a forward energy drop from a value of 12 to a value between 12 and 10 may be acceptable in and of itself and/or may be acceptable relative to a rise in efficiency in a value from between 0.6 and 0.64 to a value above approximately 0.68. Referring to FIG. 10, a change in forward and/or efficiency may be large enough when moving from a regime where alpha is approximately 1.2 and thickness ratio (and/or impedance ratio) is approximately 45 to a regime where alpha is approximately 1.3 and thickness ratio (and/or impedance ratio) is approximately 2, such that any benefit relative to increase in compactness may be outweighed. In embodiments, if compactness is the highest priority characteristic, such a change may be acceptable.

According to embodiments, any suitable calculation may be employed to produce characteristic values and/or to determine one or more parameters. In embodiments, a calculation may be executed and/or processed using a computer and/or computer readable media. Aspects of the present invention may be embodied in implementing a computer program, which may be stored on a tangible computer readable media. A computer program, when executed by one or more processors, may cause the processors to output values of one or more characteristics and/or for one or more parameters. In embodiments, performing a calculation to produce characteristic values, to determine and/or to select parameters may be accomplished implementing any suitable, analytic electromagnetic tool. In embodiments, a microwave generator may be manufactured using one or more determined and/or selected parameters.

According to embodiments, a microwave generator may be configured to connect to a load at an output section of a plurality of connected sections. In embodiments, a load may include radiators and/or antennas. In embodiments a load may include a transformer as an intermediate section between the generator and a load for the purposes of impedance matching.

According to embodiments, a signal is not required to propagate through more than one closed switch. In embodiments, each intermediate conductor may be charged to a different polarity and/or voltage, for example relative to adjacent sections. Referring back to FIG. 1, intermediate conductor 130 of section 110 may be charged (+) such that upper conductor 150 and lower conductor 140 are charged (−), or vice versa. In embodiments, intermediate conductor 131 of section 110 may be charged (−) when intermediate conductor 130 of section 110 may be charged (+), such that upper conductor 150 and lower conductor 140 of section 111 are charged (+), and/or intermediate conductor 131 may be charged (+) when intermediate conductor 130 of section 110 may be charged (−), such that upper conductor 150 and lower conductor 140 of section 111 are charged (−).

In embodiments, each intermediate conductor may be charged to the same and/or substantially the same polarity and/or voltage, for example relative to adjacent sections. Referring back to FIG. 3, intermediate conductor 130 of section 110 may be charged (+) such that upper conductor 150 and lower conductor 140 are charged (−), or vice versa. In embodiments, intermediate conductor 131 of section 111 may be charged (+) when intermediate conductor 130 of section 110 may be charged (+), such that upper conductor 150 and lower conductor 140 of section 111 are charged (−), and/or intermediate conductor 131 may be charged (−) when intermediate conductor 130 of section 110 may be charged (−), such that upper conductor 150 and lower conductor 140 of section 111 are charged (+).

In operation, sequential activation of each switch in a plurality of connected sequential sections generates microwaves into uninterrupted transmission lines which may carry a digital signal in a desired direction. In embodiments, sequentially activating switches from back to front toward a load may discharge each intermediate conductor into continuous transmission lines. In embodiments, switching timing may be selected to generate a microwave signal, for example having maximized power and/or frequency. In embodiments, the switching timing between any 2 subsequent sections from a first section to an output section may be $3\tau$, wherein $\tau$ is the transit time of the line switched first.

Referring to example FIG. 12, an output of a microwave generator having 130 stages is illustrated in accordance with one aspect of embodiments. As illustrated in one aspect of embodiments, a thickness ratio (and/or impedance ration) of 65 and/or a linear monotonic increase in unswitched thickness (and/or unswitched impedance) (i.e., alpha=1) is determined and/or selected using one or more characteristics. In embodiments, forward energy has a value of 92.02 Joules, efficiency has a value of 52.0% and energy density has a value of 4.36 J/m, where the energy density may reference the ratio of the output energy to the cumulative thicknesses in all the sections of a source. According to embodiments, dissipation may be minimized. In embodiments, power may be maximized. In embodiments, volume may be minimized. In embodiments, impedance changes from one section to another, and/or the rate at which impedance changes, may be selected. In embodiments, total impedance change between at least two sections may be selected. In embodiments, parameters may be determined based on one or more characteristics.

Many of the elements described in the disclosed embodiments may be implemented as modules. A module is defined here as an isolatable element that performs a defined function and has a defined interface to other elements. The modules described in this disclosure may be implemented in hardware, software, firmware, wetware (i.e hardware with a biological element) or a combination thereof, all of which are behaviorally equivalent. For example, modules may be implemented as a software routine written in a computer language (such as C, C++, Fortran, Java, Basic, Matlab or the like) or a modeling/simulation program such as Simulink, Stateflow, GNU Octave, or LabVIEW MathScript. Additionally, it may be possible to implement modules using physical hardware that incorporates discrete or programmable analog, digital and/or quantum hardware. Examples of programmable hardware include: computers, microcontrollers, microprocessors, application-specific integrated circuits (ASICs); field programmable gate arrays (FPGAs); and complex programmable logic devices (CPLDs). Computers, microcontrollers and microprocessors are programmed using languages such as assembly, C, C++ or the like. FPGAs, ASICs and CPLDs are often programmed using hardware description languages (HDL) such as VHSIC hardware description language (VHDL) or Verilog that configure connections between internal hardware modules with lesser functionality on a programmable device. Finally, it needs to be emphasized that the above mentioned technologies are often used in combination to achieve the result of a functional module.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A microwave generator, comprising:
    a plurality of connected sequential sections in cascade including a first section and an output section, each of the plurality of connected sections including:
    a. an intermediate conductor;
    b. an upper conductor;
    c. a lower conductor;
    d. a first isolating material having a first thickness connected between the intermediate conductor and the upper conductor;
    e. a second isolating material having a second thickness connected between the intermediate conductor and the lower conductor; and
    f. a switch connected between the intermediate conductor and one of the following:
        i. the upper conductor, the first thickness being a switched thickness and the second thickness being an unswitched thickness; and
        ii. the lower conductor, the second thickness being a switched thickness and the first thickness being an unswitched thickness; and
    wherein:
    g. the unswitched thickness of the output section is larger than the unswitched thickness of the first section; and
    h. the increase in unswitched thickness from the first section to the output section comprises a monotonic increase.

2. The microwave generator according to claim 1, wherein the switch is connected between the intermediate conductor and one of the lower conductor and the upper conductor in a majority of the plurality of connected sections.

3. The microwave generator according to claim 1, wherein the switches in adjacent sections of a majority of the plurality of connected sections is alternately connected between:
    a. the intermediate conductor and the upper conductor; and
    b. the intermediate conductor and the lower conductor.

4. The microwave generator according to claim 1, wherein the length of each of the plurality of connected sections is a quarter wavelength.

5. The microwave generator according to claim 1, wherein the microwave generator is configured for the switch in each subsequent section among the plurality of connected sections to be switched sequentially from the first section to the output section.

6. The microwave generator according to claim 5, wherein the switching timing of each subsequent section from the first section to the output section is delayed by is $3\tau$, wherein $\tau$ is the transit time of the line switched first.

7. The microwave generator according to claim 1, wherein the ratio between the unswitched thickness and the switched thickness of the output section to the unswitched thickness and the switched thickness of the first section is determined using at least one of the following characteristics:
    a. energy output;
    b. efficiency; and
    c. compactness.

8. The microwave generator according to claim 7, wherein the ratio is determined comprising a selected value for at least one of the characteristics.

9. The microwave generator according to claim 7, wherein the ratio is determined comprising a selected combination of values for all of the characteristics.

10. The microwave generator according to claim 1, wherein the monotonic increase includes at least one of:
    a. a linear increase in the unswitched thickness relative to the section number;
    b. a power curve increase in the unswitched thickness relative to the section number, wherein the power curve exponent includes values in a range smaller than 1 and larger than 1; and
    c. an exponential increase in the unswitched thickness relative to the section number.

11. The microwave generator according to claim 1, wherein the monotonic increase is determined using at least one of the following characteristics:
    a. energy output;
    b. efficiency; and
    c. compactness.

12. The microwave generator according to claim 11, wherein the monotonic increase is determined comprising a selected value for at least one of the characteristics.

13. The microwave generator according to claim 11, wherein the monotonic increase is determined comprising a selected combination of values for all of the characteristics.

14. The microwave generator according to claim 1, wherein the plurality of connected sections is in a folded configuration.

15. The microwave generator according to claim 1, wherein at least one switch comprises a photoconductive switch.

16. A method of operating the microwave generator according to claim 1, comprising sequentially activating each switch in the plurality of connected sequential sections starting at the switch in the first section and ending at the switch in the output section.

17. The method of operating the microwave generator according to claim 16, comprising delaying the switching timing between any 2 subsequent sections from the first section to the output section by $3\tau$, wherein $\tau$ is the transit time of the line switched first.

18. A method to manufacture a microwave generator comprising a plurality of connected sequential sections in cascade including a first section and an output section, the method comprising:
   a. determining, for a selected number of total sections, the ratio between:
      i. an unswitched thickness and a switched thickness of an output section; and
      ii. an unswitched thickness and the switched thickness of the first section;
   b. determining, for a selected number of total sections, a monotonic increase in unswitched thickness from the first section to the output section;
   c. manufacturing the microwave generator using said determined ratio in (a) and said monotonic increase in (b); and
wherein determining the ratio in (a) and the increase in (b) includes using at least one of the following characteristics:
   d. energy output;
   e. efficiency; and
   f. compactness.

19. A method to manufacture a microwave generator according to claim 18, wherein the monotonic increase includes at least one of at least one of:
   a. a linear increase in the unswitched thickness relative to the section number;
   b. a power curve increase in the unswitched thickness relative to the section number wherein the power curve exponent includes values in a range smaller than 1 and larger than 1; and
   c. an exponential increase in the unswitched thickness relative to the section number.

20. The method to manufacture a microwave generator according to claim 18, wherein using the at least one of the characteristics comprises a selected value for all of the characteristics.

* * * * *